United States Patent [19]

McLeod

[11] 3,838,296

[45] Sept. 24, 1974

[54] EMITTER COUPLED LOGIC TRANSISTOR CIRCUIT

[75] Inventor: Eric S. McLeod, San Jose, Calif.

[73] Assignee: National Semiconductor Corporation, Santa Clare, Calif.

[22] Filed: Oct. 29, 1973

[21] Appl. No.: 410,609

[52] U.S. Cl. ............... 307/243, 179/15 A, 307/203, 328/104, 328/154

[51] Int. Cl. ............... H03k 17/00

[58] Field of Search ............... 307/203, 242, 243; 328/104, 153, 154; 330/30 D; 179/15 A

[56] References Cited

UNITED STATES PATENTS

| | | | |
|---|---|---|---|
| 3,283,170 | 11/1966 | Buie | 307/299 A |
| 3,351,782 | 11/1967 | Narud et al. | 307/299 A |
| 3,621,288 | 11/1971 | Brown | 328/104 |
| 3,639,781 | 2/1972 | Marley | 307/243 |
| 3,764,826 | 10/1973 | Okada | 307/235 R |
| 3,783,307 | 1/1974 | Breuer | 307/243 |

*Primary Examiner*—Stanley D. Miller, Jr.

[57] ABSTRACT

In an emitter coupled logic transistor circuit, a plurality of data gates are arranged for multiplexing input data onto a common output means in response to a coded multiplex signal which selects respective data gates sequentially. A common current source is connected to respective ones of said data gates via the intermediary of respective current switch gates, such current switch gates being responsive to the decoded input select command signals for selectively energizing respective ones of said data gates, whereby power consumed by the multiplex circuit is minimized since only a selected data gate is powered up at any given time.

4 Claims, 4 Drawing Figures

EMITTER COUPLED LOGIC TRANSISTOR CIRCUIT

BACKGROUND OF THE INVENTION

The present invention relates in general to emitter coupled logic transistor circuits and more particularly to an improved multiplex circuit wherein the data gates are selectively powered up from a common current source.

DESCRIPTION OF THE PRIOR ART

Heretofore, emitter coupled logic transistor multiplex circuits have been proposed wherein a plurality of data inputs has been gated selectively onto a common output bus in response to a decoded gate select input. However, in these prior art emitter coupled circuits, the multiplexed data gates were continuously powered up from respective current sources such that at any given time every data gate was drawing current from a respective power supply. As a result the current and thus power consumption of the circuit was quite considerable.

SUMMARY OF THE PRESENT INVENTION

The principal object of the present invention is the provision of an improved emitter coupled logic transistor circuit having reduced power consumption.

In one feature of the present invention, the current source for an emitter coupled logic circuit is provided which is common to a plurality of data gates. Respective current switch gates are connected in series with the common current source and respective ones of the data gates, such current switch gates being responsive to decoded select signals for selectively powering up a respective one of the data gates from the common supply, whereby at a given time only the selected data gate is powered up thereby reducing power consumption of the circuit.

In another feature of the present invention, data gates are selected in accordance with a decoded select input signal. The decoding circuit includes a plurality of multiple emitter transistors, a true output of a respective multiple emitter transistor serving to energize a respective data gate.

Other features and advantages of the present invention will become apparent upon a perusal of the following specification taken in connection with the accompanying drawings herein:

DESCRIPTION OF THE PREFERRED EMBODIMENTS

Figures 1, 2:
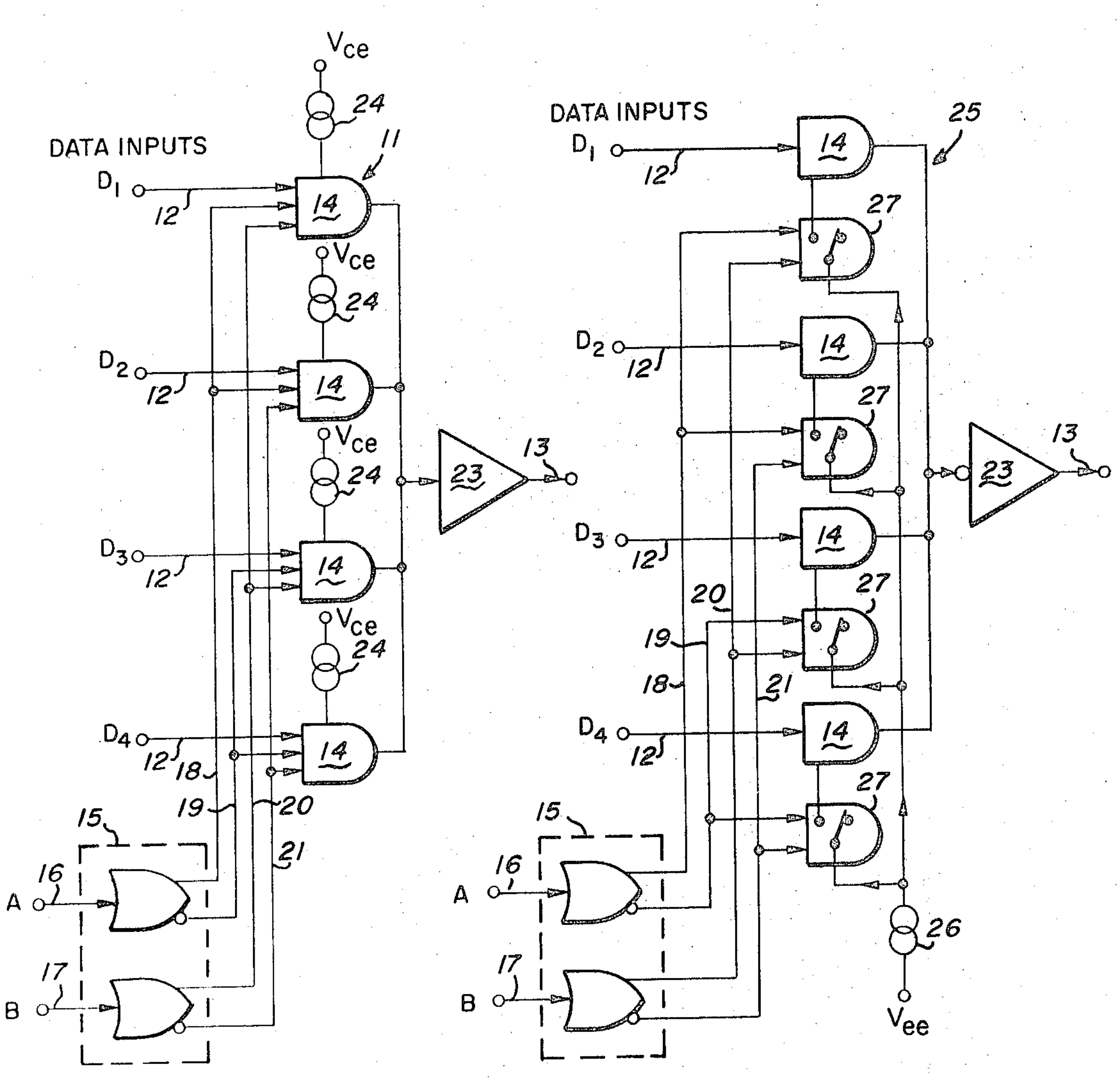
Fig 1 PRIOR ART, Fig 2
FIG. 1 is a schematic circuit diagram for a prior art emitter coupled multiplex circuit.
FIG. 2 is a schematic circuit diagram for an emitter coupled multiplex circuit incorporating features of the present invention, and FIGS. 3A and 3B taken together are a circuit diagram of the circuit of FIG. 2.

Referring now to FIG. 1 there is shown the prior art emitter coupled multiplex circuit 11. The multiplex circuit 11 includes a plurality of data input terminals 12 to which data input signals to be multiplexed are applied. An output terminal 13 is provided onto which the multiplexed data input signals are selectively applied.

A plurality of data gates 14 are provided between respective ones of the data input terminals 12 and the common output terminal 13 for selectively gating the data inputs to the common output 13.

A gate select circuit 15 is provided which receives a coded gate select input on terminals 16 and 17 and provides outputs 18–21 for selectively enabling respective ones of the data gates 14 in accordance with the coded input signals applied at input terminals 16 and 17. More particularly, the gate select circuit 15 includes a decoder for decoding the coded input signals to derive the respective output signals applied to respective gates via lines 18–21. The multiplexed outputs at the output of data gates 14 are applied to a common bus 22. The output on the common bus 22 is amplified via amplifier 23 and fed to the output terminal 13. Each of the respective data gates 14 and output amplifier 23 includes its own current source 24 for the respective circuits.

The problem with the prior art multiplex circuit 11 of FIG. 1 is that excessive power is consumed in the multiplexer 11 because each of the gates 14 and output amplifier 23 is continuously drawing current from their respective current sources regardless of whether data is being transmitted through the respective gates 14.

Referring now to FIG. 2, there is shown the emitter coupled multiplex circuit 25 of the present invention. Briefly, the multiplexer 25 is similar to that of circuit 11 with the exception that only a single current source 26 is provided and auxilliary switching gates 27 are provided in series with the common current source 26 and the respective gates 14 for selectively powering up (applying current to) the respective data gates 14 in accordance with the decoded gate select outputs on lines 18–21. In addition, current for powering up the output amplifier 23 is drawn through the series gates 27 such that the output amplifier 23 is powered up only during the time data is being transmitted through the power amplifier to the common output 13. In this manner, the power consumption of the emitter coupled multiplex circuit 25 of the present invention is substantially reduced compared to the power consumption of the prior art multiplex circuit 11.

Figure 3A:
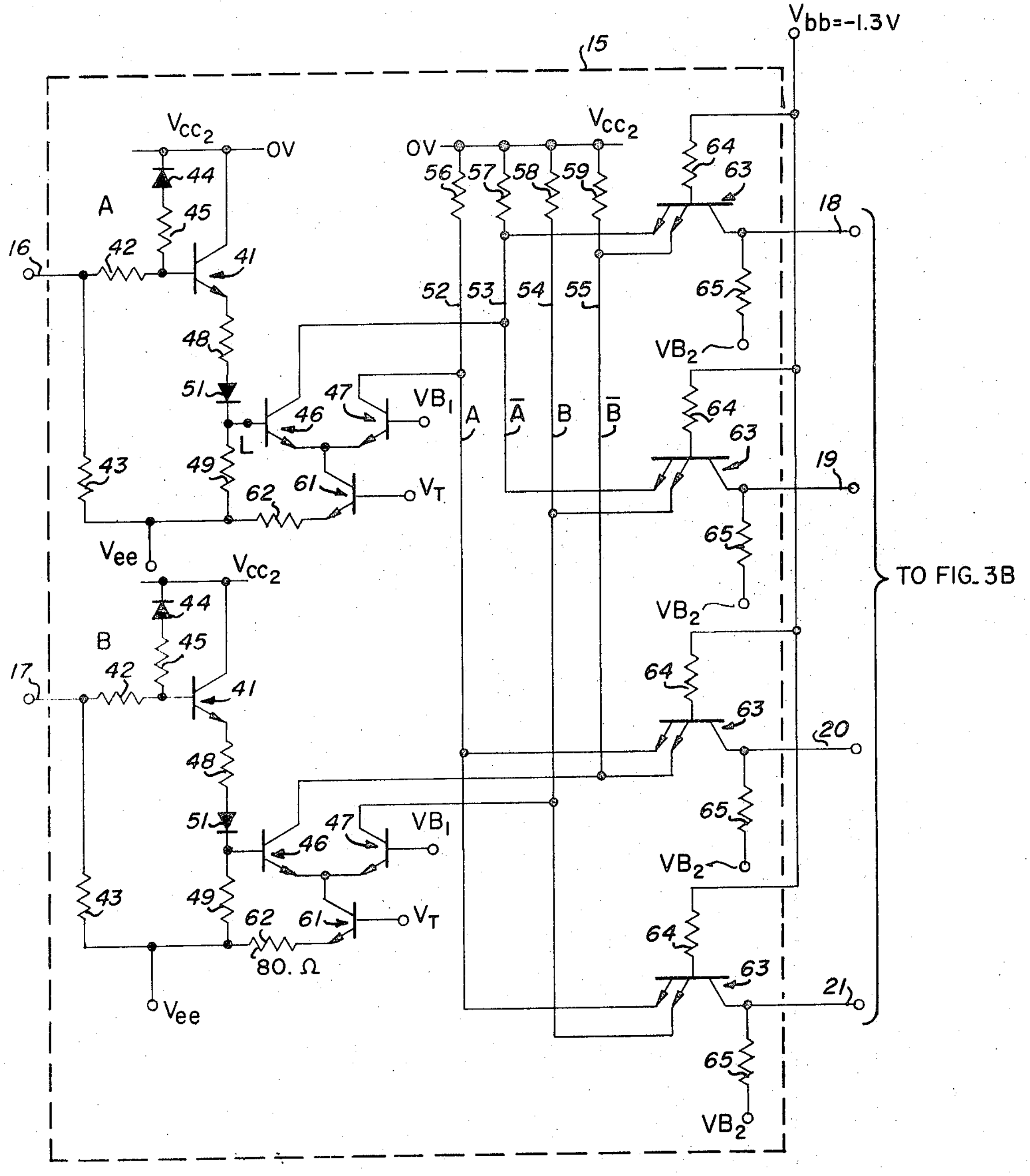
Figure 3B:
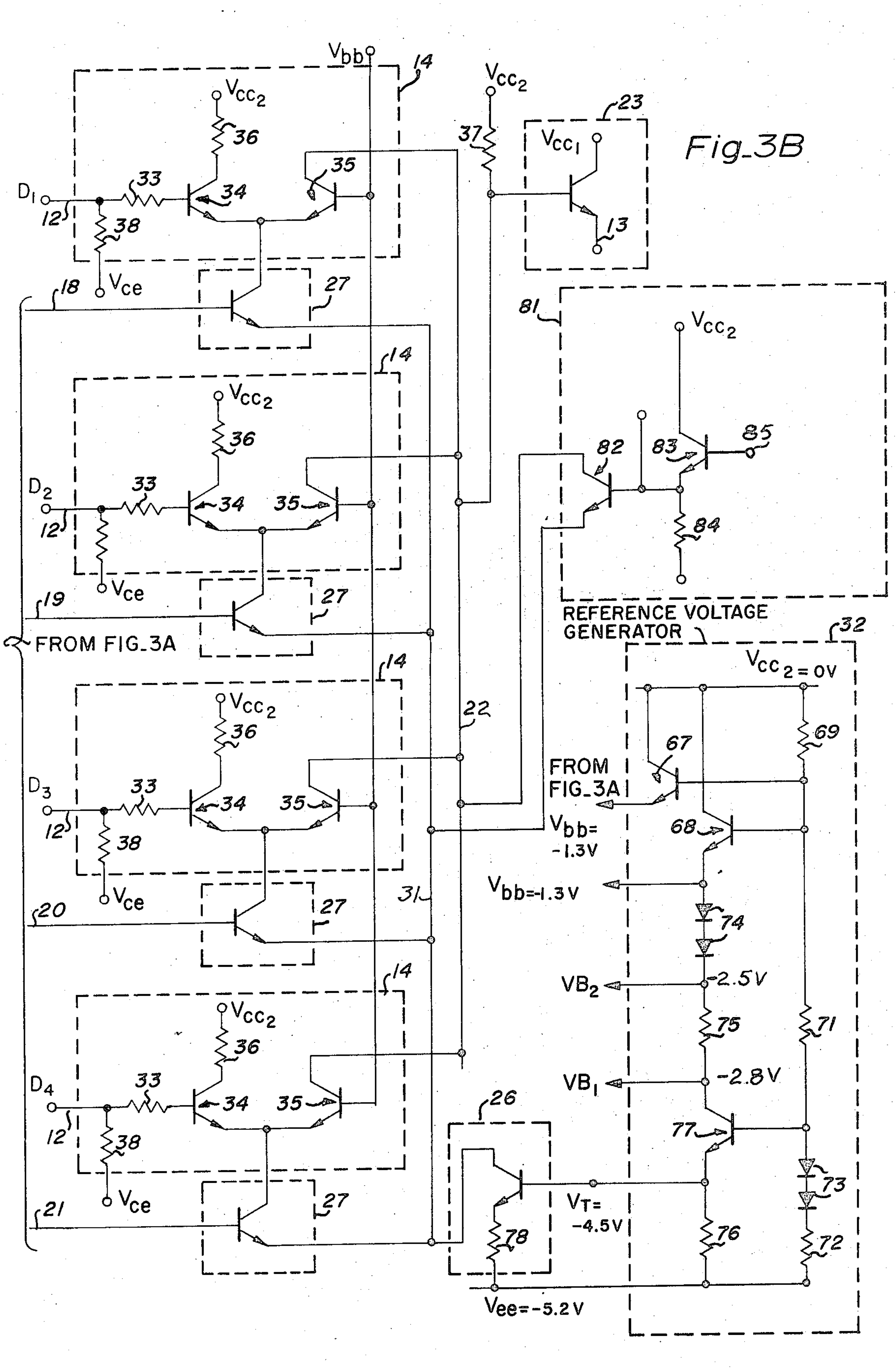

Referring now to FIGS. 3A and 3B, there is shown the emitter coupled multiplex circuit 25 of the present invention. Emitter coupled logic transistor circuits are characterized by transistors having their emitters coupled together and provided with collector load resistors driven from current sources such that the current available from the current source as caused to flow through the collector load resistor develops a voltage across the collector load resistor sufficient only to drive the transistors between a cutoff state and a linear region of transistor operation. This is contrasted with transistor-transistor logic and M.O.S. logic circuits wherein the transistors are driven between a cutoff mode and a saturated region of transistor operation. The advantage of operating the transistors in their linear region of transistor operation, as opposed to operation in the saturated region of transistor operation, is that the transistor switching time can be much faster because when the transistors are driven to saturation the base-to-collector junction capacitance stores much more charge and therefore slows down operation of the circuit. In addition, smaller voltage swings, i.e. 0.8 volts vs. 3 volts or more can be utilized in emitter coupled logic, thereby reducing switching times to approximately one-third or less of that required for saturating transistor-transistor logic or M.O.S. logic.

The circuit 25 includes the input data terminals 12 (FIG. 3B) connected to data gates 14 which are energized and powered on via current switch gates 27 connected in series between the data gates 14 and a common current source 26 which supplies the switch gates 27 from a common line 31 with a suitable collector current as of 4 milliamps. The current switch gates 27 are selectively energized via lines 18–21 where signals are derived from the gate select decoder circuit 15. The decoder 15 is responsive to input signals A and B applied to input terminals 16 and 17, respectively. Outputs of the respective data gates 14 are applied to a common bus 22 with the output of the bus 22 being buffered by output amplifier 23 to appear on output terminal 13.

A reference voltage generator 32 (FIG. 3B) is provided for generating various operating potentials: $V_{bb}$ at approximately −1.3 volts, $VB_2$ at −2.5 volts, $VB_1$ at −2.8 volts, $V_T$ at −4 volts, with Vee at −5.2 volts and $Vcc_2$ at 0 volts.

The data input terminals 12 are connected via resistors 33 to the bases of first transistors 34 of differential pairs of emitter coupled transistors 34 and 35. The collector of input transistors 34 are connected to ground $Vcc_2$, via collector load resistors 36. $Vcc_2$ is circuit ground and is at 0 volts. The collector electrodes of the second transistors 35 of the differential pairs are connected to ground via the intermediary of collector load resistor 37 at the input of the output amplifier 23. More particularly, the collectors of all the second transistors 35 of the differential pairs are connected to a common bus 22 which in turn is connected to the base of the output emitter follower transistor of amplifier 23. The collector of the output transistor 23 is connected to $Vcc_1$ which is also at circuit ground or 0 volts.

Collector load resistors 36 and 37 have values of resistance such as 227 Ω such that when the respective transistors to which the collector resistors are connected are gated on, the available current, such as 4 milliamps, drawn from the current source 26 will bias the respective transistor into a linear region of transistor operation. The data input terminals 12 are also connected to the point of lowest potential i.e. Vee namely approximately −5.2 volts, via resistors 38 each as of 50 KΩ.

The common emitter node connections of the differential pairs 34 and 35 are connected to the collectors of switching gate transistors 27. The emitters of the switching transistors 27 are connected to the current source bus 31. The output lines 18–21 from the decoder circuit 15 are connected to the respective base terminals of the switch transistors 27. A true output, for switching transistor 27 into a conductive state, corresponds to a "high" voltage on the base of the switch transistor 27. A "low" voltage appears on the base of all of the other switch transistors 27. A "high" at the base of switching transistor 27 corresponds to $V_{bb}$ (approximately −1.3 volts) less one base-to-collector voltage drop, namely $V_{BC}$ of approximately 0.6V, derived across the base-to-collector junction of the MET (Multiple Emitter Transistor) at the output of the decoder circuit 15 (FIG. 3A). This MET 63 may be replaced by a Schottky clamped transistor.

With a true ("high") applied to the base of a respective switch transistor 27, and a "high" applied to the data input terminal 12 controlled by the respective switch transistor 27, the collector current drawn from the current source transistor 26 is routed via the emitter of the switch transistor 27 to gate data input signals through the differential pair gate 14. With a "high" at the input terminal 12, the first transistor 34 of the differential pair is conductive. Thus current through the first transistor 34 flows through the collector load resistor 36 to divert current flow through the first differential transistor 34 and from the emitter of the second transistor 35 of the differential pair such that the second transistor 35 is turned off (rendered non-conductive). With the second transistor 35 of the differential pair rendered non-conductive, the base of the output transistor 23 and the collector of the second differential pair transistor 35 are raised to a "high" corresponding to essentially ground or zero volts. This causes the output transistor 23 to be rendered conductive such that the output terminal 13 is at a potential of $Vcc_1$ minus one base-to-emitter junction diode drop of 0.8 volts which corresponds to a "high" output on output terminal 13. Thus, the "high" data input signal applied to the selected input terminal 12 is multiplexed by a "true" input to the switch 27 causing the "high" data input signal to be gated through to the output terminal 13.

Correspondingly, a "low" data input signal applied to input terminal 12 renders the first transistor 34 of the differential pair non-conductive such that current is routed through the collector-to-emitter terminals of the second transistor 35 of the differential pair and through the switch transistor 27 from the current source 26. This produces a "low" at the base of the output transistor 23 since the collector current through the collector load resistor 37 serves to drop the potential at the base of the output transistor 23 thus rendering the output transistor 23 to a low state. Since the output transistor 23 is connected as an emitter follower, the output terminal 13 is dropped to a potential one $V_{BE}$ lower than the low potential derived at the base of the output transistor 23. This "low" output on terminal 13 corresponds to approximately −1.6 volts, whereas the "high" output signal on terminal 13 corresponds to approximately −0.8 volts.

Thus it is seen how a "true" output of the decoder circuit 15 as applied to the input of the current source switch 27 serves to gate the data input signal on terminal 12 via the respective data gate 14 to the common output terminal 13. All the other switching gates 27 are non-conductive such that only the selected gate and corresponding differential pair gate 14 is powered up. All the other switching gates 27 and differential pair gates 14 are deenergized such as to draw negligible current from the current source 26. Thus, a substantial saving in power consumption is achieved as contrasted with the prior art circuit of FIG. 1.

Referring now to the gate select or decoder circuit 15, (FIG. 3A) the circuit includes a pair of input terminals 16 and 17 to which binary coded input signals A and B are applied, respectively, and which taken together are determinative of the particular gate to be selected. More particularly, the following truth table applies to the input signals A and B and decoder 15:

TRUTH TABLE

| A, B | Selects Output Line |
|---|---|
| LL | 18 |
| LH | 19 |
| HL | 20 |
| HH | 21 |

Input terminals 16 and 17 are connected to a pair of identical shift networks. More particularly, respective input terminals 16 and 17 are connected to the bases of respective emitter follower transistors 41 via input resistors 42, as of 50 ohms. A relatively high value resistor 43 is connected between each of the respective input terminals 16 and 17 and the lowest potential Vee of −5.2 volts to provide a leakage path to discharge the capacitance of the base-to-emitter junction of the respective emitter follower transistors 41. A diode 44 and series resistor 45 is connected between the base of the respective emitter follower transistor 41 and the source of collector potential $Vcc_2$ of 0 volts to provide phase shift via the junction capacitance of the diode 44 through the resistor 45, as of 800 ohms for circuit stabilization.

The emitter or output of the emitter follower transistor 41 is connected to the base of a differential pair of emitter coupled transistors 46 and 47 via a potential dividing network consisting of resistors 48 and 49 as of 100 ohms and 2 KΩ, respectively, and diode 51. The collector of the first transistor 46 of channel A is connected to a second one 53 of four parallel bus lines 52–55. Each of the bus lines 52–55 is connected to circuit ground, namely $Vcc_2$ or 0 volts via load resistors 56–59, respectively. The collector of the second transistor 47 of channel A is connected to the first bus 52. The base of the second transistors 47 of both channel A and B are connected to a potential as of −2.9 volts, namely potential $VB_1$.

The common emitters of the differential pairs 46 and 47 are connected to the source of most negative potential Vee of approximately −5.2 volts via transistors 61 and emitter resistors 62 as of 80 ohms. The base of transistors 61 are connected to a voltage source at a potential as of approximately −4 volts appearing at output terminal $V_T$ of the reference voltage generator 32. The current supplied to the bases of transistors 61 serve to bias these transistors into a continuously conductive state. The collectors of transistors 56 and 47 of select line B are connected to output buses 55 and 54, respectively.

In operation, a "low" input on channel A appears as a "low" at the base or input of the first transistor 46 due to the emitter follower connection of transistor 41. A "low" at the base of transistor 46 renders transistor 46 non-conductive, thereby diverting the flow of collector-to-emitter current to the second transistor 47 to produce a "low" on bus 52 because of the voltage drop occurring in load resistors 56 and 64 on bus 52. When the first transistor 46 is rendered non-conductive by the "low" applied to its base, this causes the second bus 53 to be driven to a "high" because of the negligible current flow through the load resistor 57.

Conversely, when a "high" appears at the base of the first transistor 46 of the differential pair, the collector current will be diverted through the collector-to-emitter terminals of the first transistor 46 and away from the collector-to-emitter terminal of the second transistor 47, such that a "high" appears on output bus 52 and a "low" appears on bus 53. Thus bus 52 reproduces the input signal A, whereas bus 53 produces the the opposite or $\overline{A}$ of the input signal A. Likewise, in channel B, the input signal to channel B at terminal 17 appears on output bus 54 labeled B and the opposite to the input signal B appears on output bus 55, namely $\overline{B}$.

Multiple emitter transistors 63 are connected in circuit between respective pairs of the output buses 52–55 and output lines 18-21 of the decoder circuit 15 for supplying respective output to respective bases of the switching gates 27. More particularly, output line 18 is connected via the multiple emitter transistor 63 to buses $\overline{A}$ and $\overline{B}$ with the collector of the transistor 63 being connected to output line 18 and the two emitters being connected to buses $\overline{A}$ and $\overline{B}$. Output line 19 is connected via the emitters of transistor 63 to buses $\overline{A}$ and B, output line 20 is connected via emitters of transistor 63 to output buses A and $\overline{B}$, whereas output line 21 is connected via the emitters of transistor 63 to output buses A and B.

As previously pointed out with regard to gating of switching transistors 27, a "high" output on the respective lines 18–21 is achieved when both the emitters of the respective multiple emitter transistor 63 are connected to high outputs on buses 52–55. In other words, a "true" output is derived on the respective lines 18–21 when both emitters of the respective multiple emitter transistor 63 are high. This causes negligible or zero current to be drawn through the emitter terminals of the respective transistor 63 causing $V_{bb}$ or approximately −1.3 volts minus a base-to-collector junction voltage drop $V_{bc}$ of approximately 0.6 volts to be applied to the respective one of the output lines 18–21 or $V_{bb} - V_{Schottky}$ if a Schottky transistor 63 is used. The bases of the multiple emitter transistor 63 are connected to potential $V_{bb}$ via respective base resistors 64 as of 200 ohms. Collector load resistors 65 as of 2K ohms are connected between the respective collectors of multiple emitter transistors 63 and potential $VB_2$ as of −2.5 volts derived from the reference voltage generator 32.

The reference voltage generator 32 (FIG. 3B) is of conventional design for deriving the respective output voltages as shown and as previously described. The reference voltage generator 32 includes a pair of parallel connected transistors 67 and 68 with their collectors connected to ground potential, namely, $Vcc_2$ or 0 volts. The base potential is derived across base resistor 69 of a potential divider network consisting of resistors 69, 71, 72 and a pair of diodes 73 are all series connected between ground and Vee potential at −5.2 volts. The emitters of transistor 67 and 68 are connected to provide output potentials at approximately −1.3 volts at terminals identified $V_{bb}$. The emitter of transistor 68 is connected via a voltage dividing network to the low potential Vee of −5.2 volts via the intermediary of series diodes 74 and resistors 75 and 76 and the collector-to-emitter junction of transistor 77. Output potential $VB_2$ is provided at two diode voltage drops below $V_{bb}$ as derived across diodes 74. Resistor 75 is chosen to have a value of resistance such that the potential appearing at output terminal $VB_1$ is 0.3 volt below the potential $VB_2$, namely, approximately −2.8 volts. Resistor 76 is chosen to have a value of resistance relative to the value of resistor 72 and the voltage drop across the pair of diodes 73 to provide an output voltage of approximately −4.0 volts at the emitter of transistor 77 such voltage appearing at output terminal $V_T$. This voltage also drives the base of the constant current source transistor 26 having an emitter load resistor 78 connected between the emitter of transistor 26 and potential Vee of −5.2 volts.

Circuit 81 is provided to disable or enable the multiplex circuit. When input pin 85 is at a logical high state then the current from current source 26 is forced to flow thru the transistor 82 and then thru collector load resistor 37, thereby forcing output 13 to a logical low state regardless of the logic condition of the data select terminals 16 and 17 or of the data terminals 12. If, however, pin 85 is held at a logical low state, then the multiplexer is enabled, and the output logic state then becomes a function of the logic condition of the data select and data terminals. Also circuit 81 retains the output transistor 23 in a "low" output state during the time between sequential switching of respective data input gates 14 so as to avoid saturation of the second transistor of the differential pairs 34 and 35. More particularly, circuit 81 includes a first transistor 82 having its collector connected to output bus 22 and thence to the input or base of output transistor 23. The emitter of transistor 82 is connected to the constant current source 26 via bus 31. The base of transistor 82 is driven from the output of an emitter follower connected transistor 83, which is connected in the same manner as emitter follower transistor 41 previously described with regard to the gate select circuit 15, except that a load resistor 84 is connected between the emitter of transistor 83 and the source of most negative potential Vee, as of −5.2 volts. An input logic level as of −0.8 volts for a logic "high" and −1.6 volts for a logic "low" is applied to the base of the emitter follower transistor 83 via input terminal 85.

Although the multiplex circuit 25 has been described, thus far, employing four gated input data channels, it is to be understood that any number of such channels can be provided as determined by the capacity of the decoder circuit 15. To handle more than four data input terminals 12 the decoder circuit 15 requires additional parallel channels and additional output buses 51–55. In any case, the power saving of the present invention is directly proportional to the number of multiplexed channels when contrasted with the prior art circuit of FIG. 1.

What is claimed is:

1. In an emitter coupled logic transistor circuit:
- a common output means;
- a plurality of data gate means to which a plurality of respective data input signals are to be applied for gating onto said common output means;
- current source means common to said plurality of data gates for supplying current thereto;
- current source gate means connected in series with said common current source means and respective ones of said data gate means for gating current to respective ones of said data gate means for energizing same; and
- decoder means responsive to coded input signals to selectively energize respective ones of said current source gate means for selectively energizing respective ones of said data gate means for selectively gating respective data input signals onto said common output means.

2. The apparatus of claim 1 wherein said decoding means includes a plurality of multiple emitter transistor means, respective ones of said multiple emitter transistor means being connected with their multiple emitters to receive coded input signals for decoding same to derive respective true output signals when a plurality of said emitters have true inputs, means for connecting the output of respective ones of said multiple emitter transistor means to respective inputs of said current source gate means for gating open respective ones of said current source gate means in response to the respective true outputs of said multiple emitter transistor means.

3. The apparatus of claim 1 wherein respective ones of said data gate means include a pair of transistors having base, emitter and collector terminals, said transistors being connected with their collector-to-emitter terminals in parallel and with their emitter terminals connected together.

4. The apparatus of claim 3 wherein respective ones of said current source gate means are connected in series between said common current source means and said common emitter terminals of respective pairs of said data gate transistors.

* * * * *